(12) United States Patent
Li et al.

(10) Patent No.: US 11,818,855 B2
(45) Date of Patent: Nov. 14, 2023

(54) ADAPTER DEVICE, BRACKET ASSEMBLY COMPATIBLE WITH BOTH OCP CARD AND PCIE CARD, AND SERVER

(71) Applicant: Fulian Precision Electronics (Tianjin) Co., LTD., Tianjin (CN)

(72) Inventors: Han-Yu Li, New Taipei (TW); Gong-Wen Zhang, Tianjin (CN); Yang Li, Tianjin (CN); Jun Li, Shenzhen (CN); San-Long Zhou, Tianjin (CN); Jin-Xing Zhang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/852,334

(22) Filed: Jun. 28, 2022

(65) Prior Publication Data
US 2023/0050441 A1   Feb. 16, 2023

(30) Foreign Application Priority Data
Aug. 11, 2021   (CN) .......................... 202121881106.9

(51) Int. Cl.
| G06F 1/16 | (2006.01) |
| H05K 5/00 | (2006.01) |
| H05K 7/00 | (2006.01) |
| H05K 5/02 | (2006.01) |

(52) U.S. Cl.
CPC .................................. H05K 5/0282 (2013.01)

(58) Field of Classification Search
CPC .. H05K 5/0282; H05K 5/0286; H05K 5/0291; H05K 5/0256; G06F 1/181; G06F 1/183; G06F 1/185; G06F 1/186; G06F 1/187
See application file for complete search history.

(56) References Cited

U.S. PATENT DOCUMENTS

| 6,460,098 | B1 * | 10/2002 | Paul .................... G06F 13/4086 |
| | | | 710/63 |
| 7,952,887 | B2 * | 5/2011 | Kosugi ................ H05K 7/1409 |
| | | | 361/752 |
| 9,019,711 | B2 * | 4/2015 | Tamura .................. H01R 13/62 |
| | | | 361/752 |
| 10,178,807 | B2 * | 1/2019 | Conn ....................... G06F 1/183 |
| 10,537,035 | B2 * | 1/2020 | Adrian ................. G11B 5/4806 |
| 10,588,237 | B2 * | 3/2020 | Zhai ....................... H01R 31/06 |
| 2010/0254096 | A1 * | 10/2010 | Kim ........................ G06F 1/185 |
| | | | 361/737 |

(Continued)

*Primary Examiner* — Anthony M Haughton
(74) *Attorney, Agent, or Firm* — ScienBiziP, P.C.

(57) ABSTRACT

An adapter device enabling a peripheral component interconnect express (PCIe) slot in a server to additionally accept an open compute project (OCP) card includes a bracket assembly compatible with an OCP card and a server. The adapter device comprises a chassis, a front-end bracket, an adapter assembly, and a rail assembly. The front-end bracket defines a first inserting port for OCP card insertion, the adapter assembly comprises OCP interface, adapter circuit board, and PCIe interface. The PCIe interface is connected to the adapter circuit board, and the adapter circuit board provides electrical connection and conversion between OCP interface and PCIe interface. The rail assembly between the front-end bracket and the OCP interface carries in the OCP card when the card is inserted.

15 Claims, 5 Drawing Sheets

(56) References Cited

U.S. PATENT DOCUMENTS

| | | | |
|---|---|---|---|
| 2010/0254100 A1* | 10/2010 | Kim | H05K 7/1461 |
| | | | 361/752 |
| 2018/0101500 A1* | 4/2018 | Heyd | G06F 13/4022 |
| 2019/0079890 A1* | 3/2019 | Matula | G06F 13/4045 |
| 2021/0011529 A1* | 1/2021 | Escamilla | G06F 1/186 |
| 2021/0120692 A1* | 4/2021 | Nielsen | H05K 5/0086 |
| 2022/0201909 A1* | 6/2022 | Tsorng | H05K 7/1415 |

* cited by examiner

ADAPTER DEVICE, BRACKET ASSEMBLY COMPATIBLE WITH BOTH OCP CARD AND PCIE CARD, AND SERVER

FIELD

The subject herein generally relates to servers, more particularly to an adapter device for peripheral component interconnect express (PCIe) slot, a bracket assembly compatible with an open compute project (OCP) card and a PCIe card, and a server.

BACKGROUND

PCIe and OCP are two common forms of computer data interface which are widely used in servers.

In some servers, the space for receiving PCIe cards or OCP cards is dedicated to the one or the other and cannot be interchanged, which affects the utilization of the space of the server.

SUMMARY OF THE INVENTION

The disclosure aims to provide an adapter device, and a bracket assembly compatible with both OCP card and PCIe card, together with a server.

In a first aspect, the embodiment of the disclosure provides an adapter device for PCIe slot comprising a chassis, a front-end bracket, an adapter assembly, and a rail assembly. The front-end bracket defines a first inserting port for OCP card for connection to the chassis. The adapter assembly comprises an OCP interface, an adapter circuit board, and a PCIe interface. The adapter circuit board is connected to the rear end of the chassis. The interface piece is connected to the adapter circuit board and is opposite to the first inserting port. The PCIe interface is connected to one end of the adapter circuit board away from the first inserting port. The adapter circuit board provides electrical connection between the OCP interface and the PCIe interface to realize interface conversion. The rail assembly is arranged between the front-end bracket and the OCP interface and is opposite to the first inserting port.

When the adapter device in the embodiment of the disclosure is used, the adapter device is installed on the PCIe bracket, and the adapter device and the PCIe bracket then form a structure capable of receive the OCP card.

The OCP card is inserted from the first insertion port and enters along the rail assembly until the OCP card is connected to the OCP interface.

The adapter device in this embodiment breaks the traditional means of fixing OCP and can be installed in the PCIe bracket for receiving the OCP card. This meets different configuration requirements and has strong interchangeability. Moreover, the scheme has simple structure and low cost.

Optionally, the chassis includes a bottom plate and two flanging portions connected to the bottom plate on each side. Wherein the bottom plate defines opposed upper and lower surfaces, and the two flanging portions are located on the upper surface of the bottom plate. Wherein the rail assembly includes two rails opposite to each other, each rail is connected to one of the two flanging portions.

Optionally, each of the two flanging portions includes a vertical flanging portion and a horizontal flanging portion connected to the vertical flanging portion. Each of the two horizontal flanging portions is spaced from and opposite to the bottom plate, and a receiving space is defined between each horizontal flanging portion and the bottom plate. Each of the two rails includes a rail portion and a connecting portion attached to or formed with the rail portion, wherein the connecting portions positioned between the vertical flanging portions and the bottom plate are connected to the vertical flanging portions. Each of the rail portions defines a guide slot, and the guide slots of the two rails are laterally opposite, the guide slots can receive both sides of the OCP card.

Optionally, each connecting portion is attached to or formed with one of the rail portions on a side away from each rail slot, the connecting portions are generally elongated. An upper surface of the connecting portions is lower than an upper surface of each rail portion. Each of the connecting portions is provided with a positioning protrusion on its upper surface, and each of the horizontal flanging portions is provided with a laterally-open positioning slot adapted to each positioning protrusion. Each horizontal flanging portion is provided with a connecting aperture, and each of the connecting portions is provided with a threaded aperture opposite to the connecting aperture, to receive a connecting screw to attach each connecting portion to each horizontal flanging portion.

Optionally, a lower surface of the front end of the bottom plate is raised up to form an installation slot. The front-end bracket includes a socket bracket and a connecting bracket, and the connecting bracket is connected between the socket bracket and the bottom plate. The socket bracket includes a first plate, a second plate, and a third plate, wherein the first inserting port is provided on the first plate, and the second plate and the third plate are respectively connected to opposed upper and lower sides of the first plate. The connecting bracket includes a fourth plate and a fifth plate, wherein the fourth plate positioned in the installation slot is fixedly connected to the front end of the bottom plate, and the fifth plate is vertically connected between the fourth plate and the third plate.

Optionally, a lower surface of a front end of each rail is supported on an upper surface of the third plate, and a front end surface of each rail abuts the first plate. Two cuts opposite to the guide slots of the two rails are defined on the first plate at both sides of the first inserting port.

In a second aspect, the embodiment of the disclosure provides a bracket assembly compatible with an OCP card and PCIe card. The bracket assembly comprises a PCIe bracket and the adapter device as provided above, wherein the adapter device is detachably connected to the PCIe bracket.

Optionally, the PCIe bracket includes a main frame piece and a front frame piece, wherein the main frame piece defines an installation space configured to receive the PCIe card. The front frame piece connected to a front end of the main frame piece is provided with a second inserting port communicating with the installation space. The adapter device is in the installation space, wherein the chassis is detachably connected to the main frame piece, the front-end bracket is detachably connected to the front frame piece, and the first inserting port is opposite to and communicating with the second inserting port.

Optionally, an assembly and disassembly port is provided on one side of the PCIe bracket, the assembly and disassembly port is in communication with the installation space and configured to allow the insertion of the adapter device. A clamping notch is provided with the front frame piece at a side away from the assembly and disassembly port of the front frame piece, and a first bending plate portion is provided on the front frame piece at a side adjacent to the assembly and disassembly port of the front frame piece. The first bending plate portion is perpendicular to a plane defined by the second inserting port. An inserting sheet is provided with the front-end bracket at a side away from the assembly and disassembly port of the front-end bracket, and a second bending plate portion perpendicular to the plane where the first inserting port is located is provided with the front-end bracket at a side near the assembly and disassembly port of the front-end bracket. The inserting sheet is inserted laterally and matched in the clamping notch, and the second bending plate portion is superposed on and connected to the first bending plate portion by a fastener.

In a third aspect, the embodiment of the disclosure further provides a server. The server comprises a plurality of card mounting positions, and at least one of the card mounting positions can receive the bracket assembly above.

The bracket assembly provided above allows the server to easily change and adapt to either PCIe cards or OCP cards, which is advantageous in utilizing space of the server.

Figure 1:
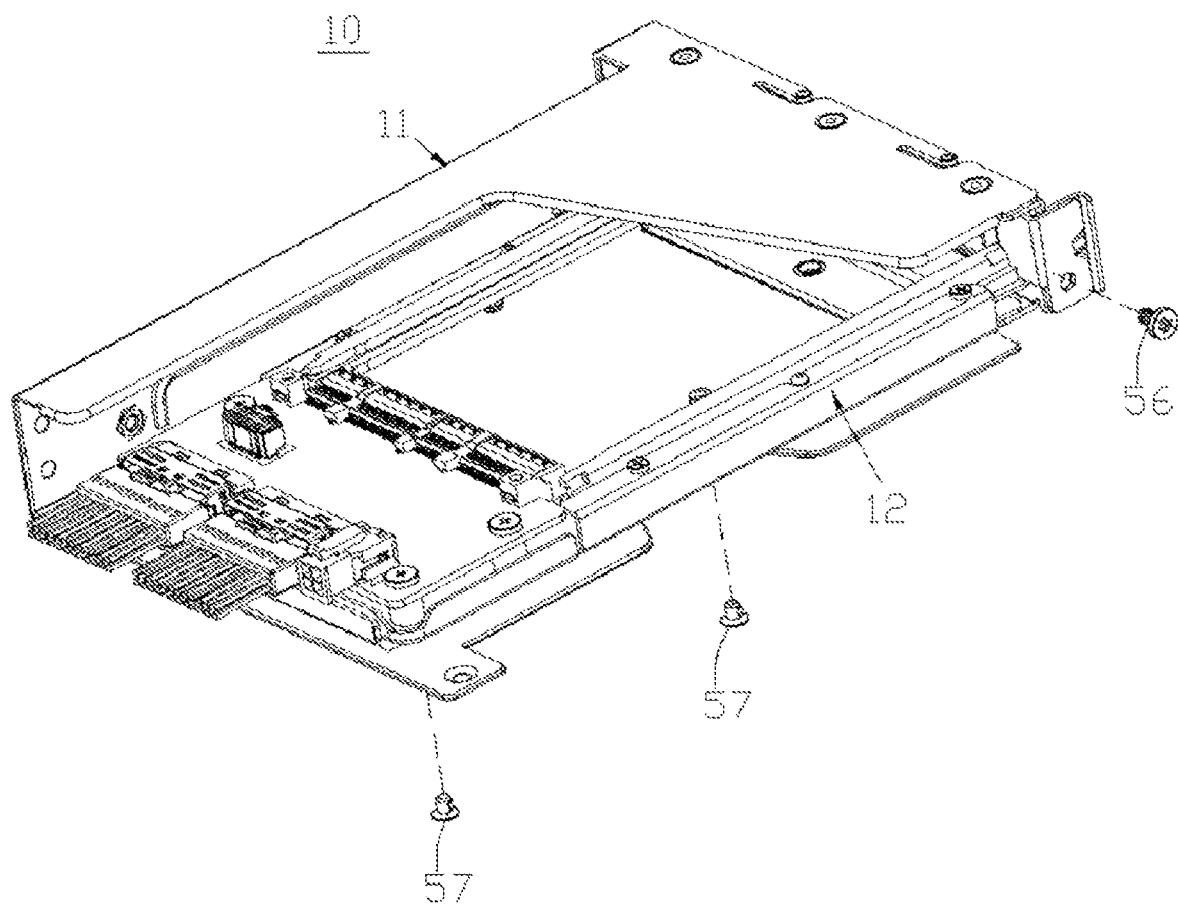
FIG. 1 is a perspective schematic view of the bracket assembly according to an embodiment of the disclosure, the adapter device being attached to a PCIe bracket.

DESCRIPTION OF MAIN COMPONENT SYMBOLS bracket assembly 10
PCIe bracket 11
adapter device 12
main frame piece 13
front frame piece 14
installation space 15
upper plate 16
lower plate 17
side plate 18
assembly and disassembly port 19
first front plate 20
first bending plate portion 21
second inserting port 22
clamping notch 23
chassis 24
front-end bracket 25
adapter assembly 26
rail assembly 27
first inserting port 28
OCP interface 29
adapter circuit board 30
PCIe interface 31
bottom plate 32
flanging portion 33
rail 34
vertical flanging portion 35
horizontal flanging portion 36
rail portion 37
connecting portion 38
guide slot 39
positioning protrusion 40
connecting aperture 41
threaded aperture 42
connecting screw 43
installation slot 44
socket bracket 45
connecting bracket 46
first plate 47
second plate 48
third plate 49
fourth Plate 50
fifth Plate 51
cut 52
positioning slot 53
second bending plate portion 54
inserting sheet 55
fastener 56
screw 57
server 58
card mounting position 59
OCP card 60

DETAILED DESCRIPTION

The technical scheme in the embodiment of the application will be described in combination with the attached drawings in the embodiment of the application. Obviously, the described embodiments are only part of the embodiments of the application, not all embodiments.

It should be noted that when an element is said to be "fixed to" another element, it can be directly in contact with another element or there can be an intervening element. When a component is "connected" to another component, it can be directly connected to another component or there may be intermediate components at the same time. When a component is "set on" another component, it can be set directly on another component or there may be intervening components at the same time. The terms "vertical", "horizontal", "left", "right" and similar expressions used in this paper are for illustrative purposes only.

Unless otherwise defined, all technical and scientific terms used herein have the same meanings as those commonly understood by those skilled in the technical field of the application. The terms used in the specification of the application herein are only for the purpose of describing specific embodiments and are not intended to limit the application. The term "and/or" as used herein includes any and all combinations of one or more related listed items.

Some embodiments of the present application are described in detail. Without conflict, the following embodiments and features in the embodiments can be combined with each other.

Embodiments of Disclosure

Figure 2:
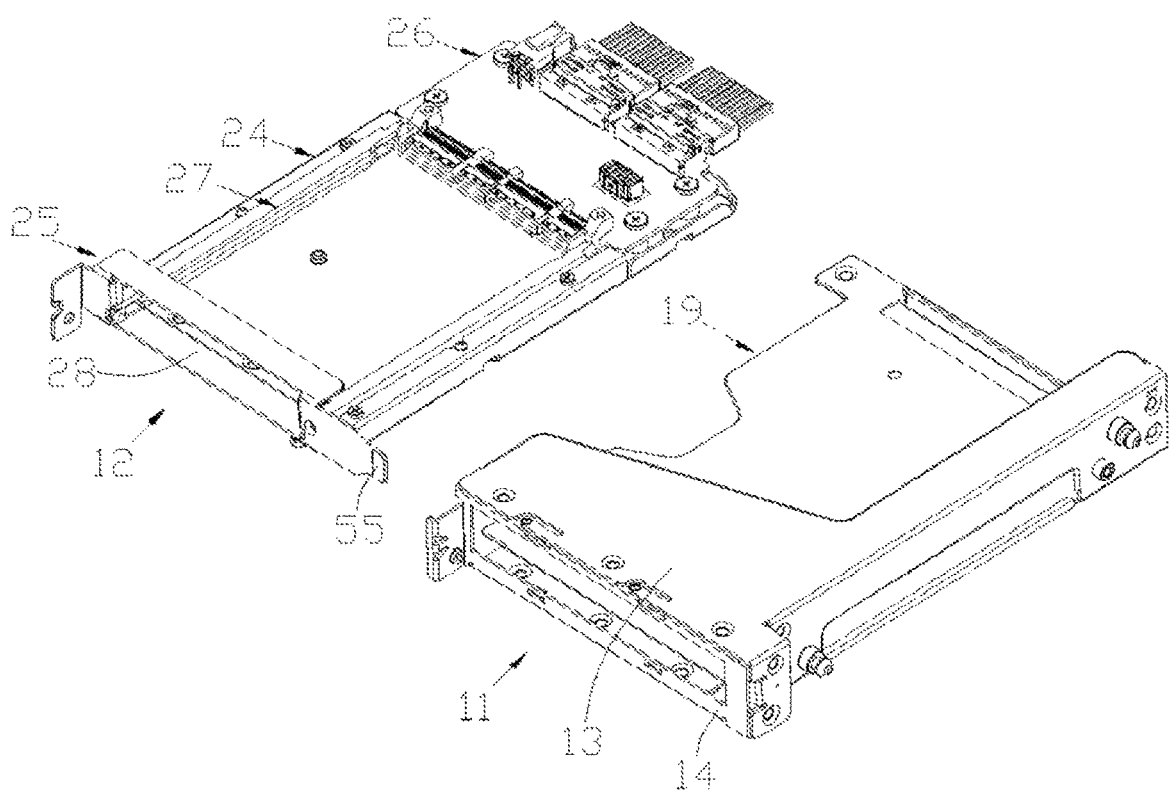
FIG. 2 is a perspective schematic view of the bracket assembly according to an embodiment of the disclosure, the adapter device being separated from the PCIe bracket.
Figure 3:
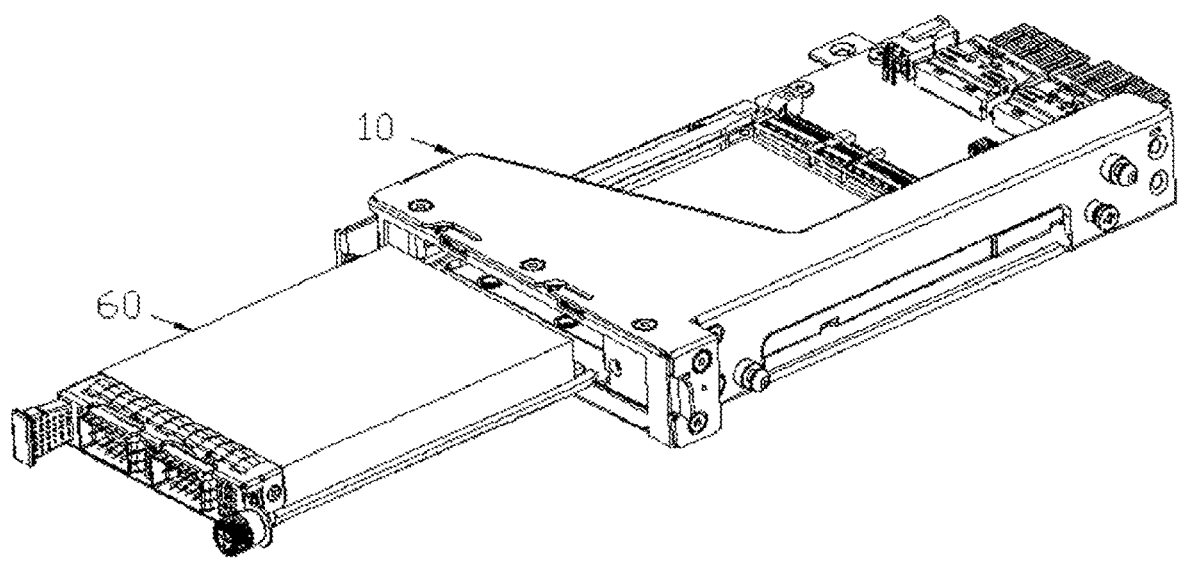
FIG. 3 is a schematic diagram of the bracket assembly and the OCP card, the OCP card being ready to be inserted into the bracket assembly.
Figure 8:
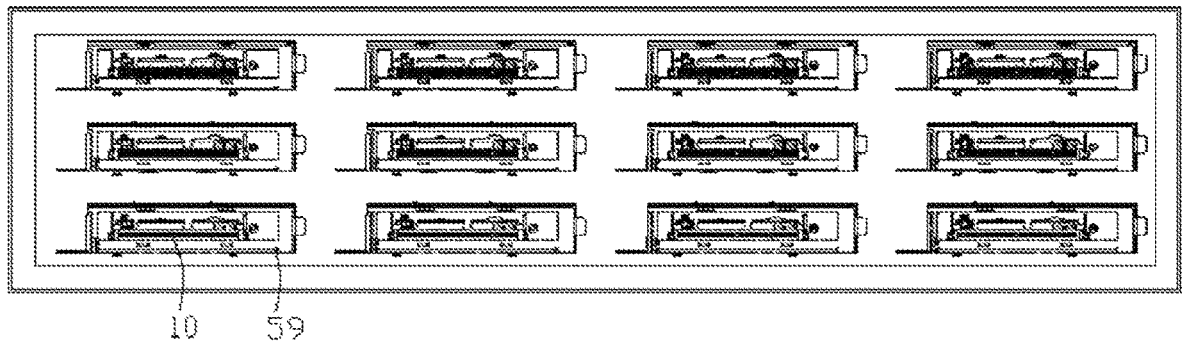
FIG. 8 is a schematic diagram of the server according to an embodiment of the disclosure.

Referring to FIGS. 1 to 3, the present embodiment provides a bracket assembly 10 compatible with an OCP card 60 and a PCIe card (not shown), which may be used in a server 58 (see FIG. 8). The specific OCP card 60 in this embodiment may be an OCP 3.0 card.

The bracket assembly 10 in the embodiment comprises a PCIe bracket 11 and an adapter device 12 detachably connected to the PCIe bracket 11.

Figure 4:
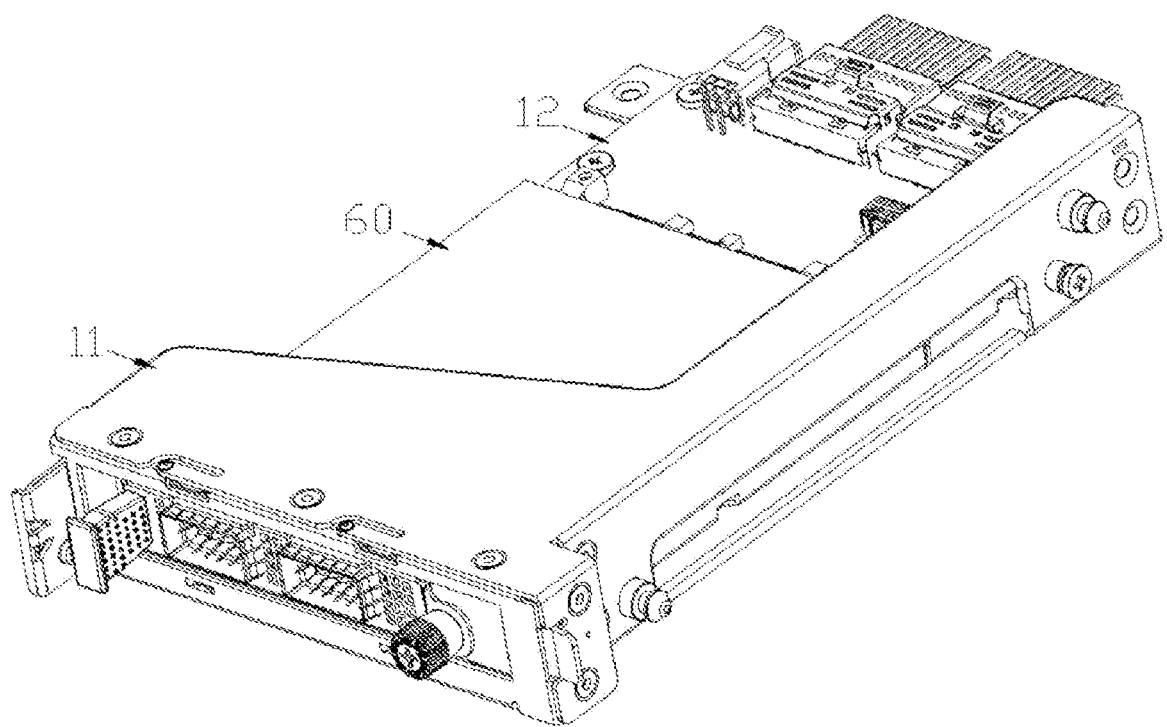
FIG. 4 is a schematic diagram of the bracket assembly and the OCP card, the OCP card is inserted into the bracket assembly.

The bracket assembly 10 provided by the present embodiment may be installed on the server 58. When the adapter device 12 of the bracket assembly 10 is removed, the original PCIe bracket 11 of the bracket assembly 10 on the server 58 can be used to receive the PCIe card. When the adapter device 12 of the bracket assembly 10 is fitted, the bracket assembly 10 can be used to receive the OCP card 60, which is conducive to the space configuration of the server 58. FIG. 3 and FIG. 4 illustrate the state of OCP card 60 during and after installation.

Figure 5:
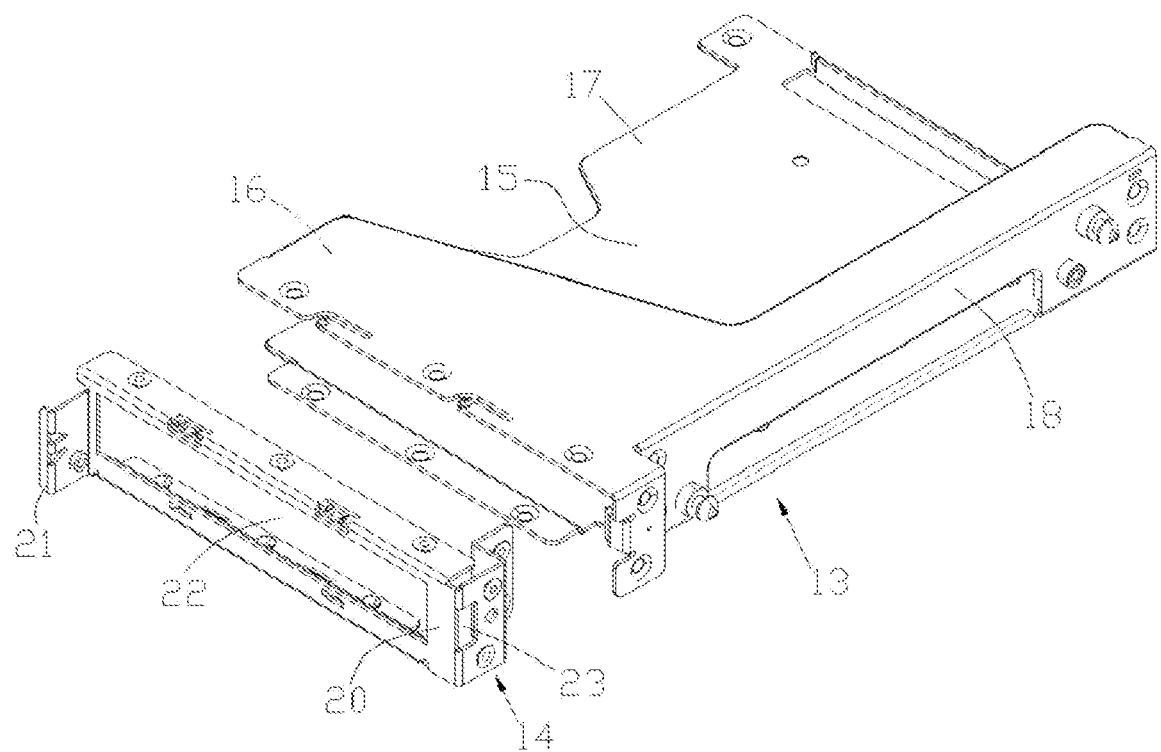
FIG. 5 is an expanded view of the PCIe bracket according to an embodiment of the disclosure.

Referring to FIG. 5, the PCIe bracket 11 provided in this embodiment includes a main frame piece 13 and a front frame piece 14. The main frame piece 13 defines an installation space 15 configured to receive the PCIe card, the front frame piece 14 connected to a front end of the main frame piece 13 is provided with a second inserting port 22 communicating with the installation space 15. The PCIe card can be inserted into the installation space 15 through the second inserting port 22 when a PCIe card is to be installed.

Alternatively, the main frame piece 13 includes an upper plate 16 and a lower plate 17 spaced from each other, together with a side plate 18 vertically connected to the upper plate 16 and the lower plate 17 at same side. The upper plate 16, the side plate 18 and the lower plate 17 together form the installation space 15 with openings on one side and at the front and rear ends. The opening on one side is used as an assembly and disassembly port 19 communicating with the installation space 15 which laterally receives the adapter device 12. The shapes of the upper plate 16 and the lower plate 17 can be slotted or partially cut 52 according to the actual needs, not specifically limited here.

The front frame piece 14 is connected to the front end of the main frame piece 13. Specifically, the front frame piece 14 includes a first front plate 20 and a first bending plate portion 21. The first front plate 20 is connected to the front end of the main frame piece 13 and covers a front end opening of the installation space 15. The second inserting port 22 is located at the first front plate 20. A side away from the assembly and disassembly port 19 of the first front plate 20 is provided with a clamping notch 23, and a side close to the assembly and disassembly port 19 of the first front plate 20 is provided with the first bending plate portion 21 connected to the first front plate 20, and perpendicular to the first front plate 20. The first front plate 20 and the first bending plate portion 21 substantially form an L-shaped structure.

The front frame piece 14 and the main frame piece 13 can be connected by connecting structures such as fasteners 56.

On the one hand, the front frame piece 14 is configured to match the PCIe card. On the other hand, the front frame piece 14 is also suitable for connecting the adapter device 12. The connecting structure of the front frame piece 14 and the adapter device 12 are described in detail below.

Figure 6:
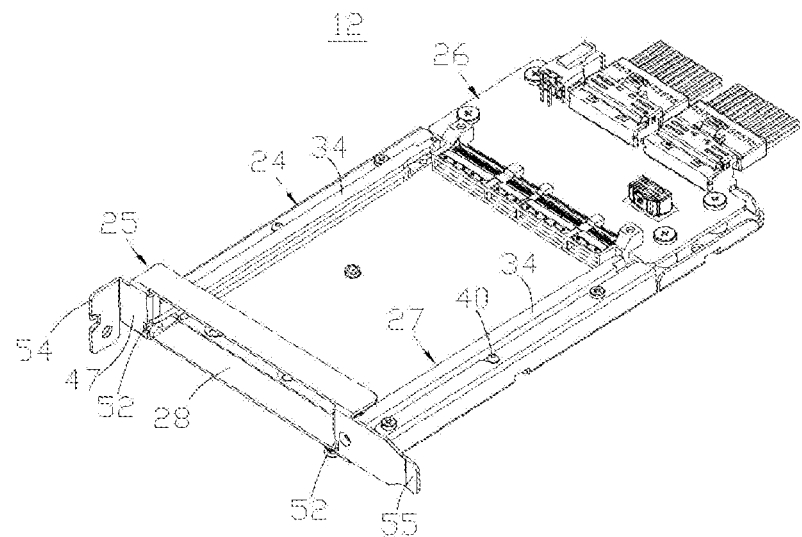
FIG. 6 is a perspective schematic view of the adapter device according to an embodiment of the disclosure.
Figure 7:
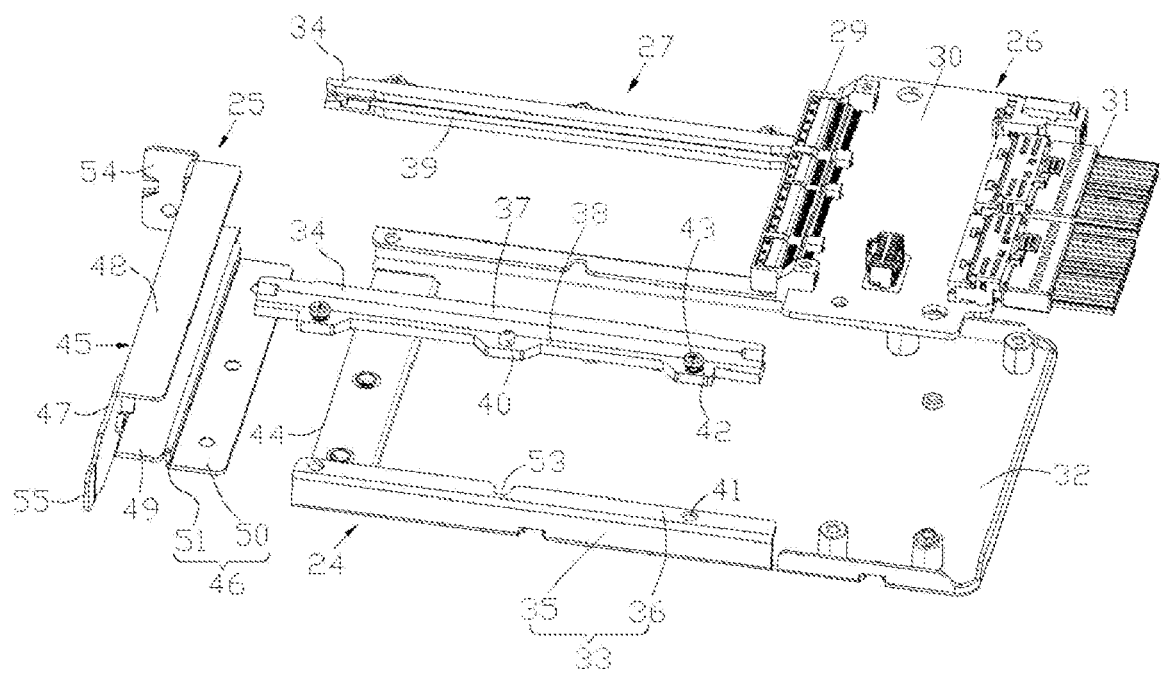
FIG. 7 is an expanded view of the PCIe bracket of FIG. 6.

Referring to FIG. 6 and FIG. 7, the adapter device 12 provided in the embodiment of the disclosure includes a chassis 24, a front-end support 25, an adapter assembly 26, and a rail assembly 27. The front-end bracket 25 is connected to a front end of the chassis 24 and defines a first inserting port 28 which is sized to receive the OCP card 60. The adapter assembly 26 comprises an OCP interface 29, an adapter circuit board 30, and a PCIe interface 31, wherein the adapter circuit board 30 is connected to a rear end of the chassis 24. The OCP interface 29 opposite to the first inserting port 28 is connected to the adapter circuit board 30, the PCIe interface 31 is connected to an end away from the first inserting port 28 of the adapter circuit board 30, and the adapter circuit board 30 is electrically connected between the OCP interface 29 and the PCIe interface 31 to realize interface conversion. The rail assembly 27 is opposite to the first inserting port 28 and positioned between the front-end bracket 25 and the OCP interface 29.

When the adapter device 12 in the embodiment of the disclosure is used, the adapter device 12 is installed on the PCIe bracket 11, then the adapter device 12 and the PCIe bracket 11 form a structure capable of receiving an OCP card 60.

The OCP card 60 is inserted from the first insertion port 28 and enters along the rail assembly 27 until the OCP card 60 is connected to the OCP interface 29.

Therefore, the adapter device 12 in this embodiment breaks from traditional means of fixing in the OCP manner and can be installed in the PCIe bracket 11 for receiving the OCP card 60, which meets different configuration requirements and has good interchangeability. Moreover, the scheme has simple structure and low cost.

In another embodiment, the chassis 24 includes a bottom plate 32 and two flanging portions 33 connected to the bottom plate 32 on each side. The chassis 24 is generally flat. The bottom plate 32 of the chassis 24 defines opposed upper and lower surfaces, and the two flanging portions 33 are located on the upper surface of the bottom plate 32. The rail assembly 27 includes two rails 34 opposite to each other, each rail 34 is connected to one of the two flanging portions 33. Optionally, each of the two flanging portions 33 includes a vertical flanging portion 35 and a horizontal flanging portion 36 connected to the vertical flanging portion 35. Each horizontal flanging portion 36 is spaced from and opposite to the bottom plate 32, and a receiving space (not shown) is defined between each of the two horizontal flanging portions 36 and the bottom plate 32. Each of the two rails 34 includes a rail portion 37 and a connecting portion 38 attached to or formed with the rail portion 37, wherein the connecting portions 38 positioned between the vertical flanging portions 35 and the bottom plate 32 are connected to the vertical flanging portions 35. Each rail portion 37 defines a guide slot 39, and the guide slots 39 of the two rails 34 are laterally opposite, the guide slots 39 are configured to slidably receive both sides of the OCP card 60.

The installation space 15 receives part of the guide rail 34, and the horizontal flanging portions 36 can be set at an appropriate height according to the required installation height of the guide rail 34. By connecting the connecting portion 38 to the horizontal flanging portion 36, the guide rail 34 can be held suspended, avoiding the possible unevenness of the bottom plate 32, which may affect the structure on the lower surface of the guide rail 34.

Optionally, each connecting portion 38 is attached to or formed with one of the rail portions 37 on a side away from each rail 34 slot. The connecting portions 38 are generally elongated, and an upper surface of the connecting portions 38 is lower than an upper surface of each rail portion 37. Each of the connecting portions 38 is provided with a positioning protrusion 40 on its upper surface, and each of the horizontal flanging portions 36 is provided with a positioning slot 53 opened laterally and adapted to each positioning protrusion 40. Each of the horizontal flanging portions 36 is provided with a connecting aperture 41, and each of the connecting portions 38 is provided with a threaded aperture 42 opposite to the connecting aperture 41 to receive a connecting screw 43, to attach each connecting portion 38 to each horizontal flanging portion 36. Through this arrangement, when the guide rail 34 is installed, the positioning protrusion 40 is laterally matched with the positioning slot 53 to position and hold the guide rail 34 along its extension direction. In addition, the upper surface of the connecting portion 38 is lower than the upper surface of the rail portion 37, forming a step, which brings the step surface against the side of the horizontal flanging portion 36, to realize the lateral positioning of the guide rail 34. Finally, the connecting portion 38 is locked under the horizontal flanging portion 36 by the connecting screw 43, so that the upper surface of the connecting portion 38 abuts the lower surface of the horizontal flanging portion 36, so as to fix the height position of the guide rail 34. In general, through the structures described here, the positioning of the guide rail 34 in length, in height, and laterally is easily realized, and the installation position of the guide rail 34 is accurate, so as to match the OCP card 60.

In one optional embodiment, a lower surface of the front end of the bottom plate 32 is concave upward to form an installation slot 44. The front-end bracket 25 includes a socket bracket 45 and a connecting bracket 46, and the connecting bracket 46 is connected between the socket bracket 45 and the bottom plate 32. The socket bracket 45 includes a first plate 47, a second plate 48 and a third plate 49, wherein the first inserting port 28 is provided on the first plate 47, and the second plate 48 and the third plate 49 are respectively connected to opposed upper and lower sides of the first plate 47. The connecting bracket 46 includes a fourth plate 50 and a fifth plate 51, wherein the fourth plate 50 positioned in the installation slot 44 is fixedly connected to the front end of the bottom plate 32, and the fifth plate 51 is vertically connected between the fourth plate 50 and the third plate 49. The installation slot 44 can be formed by punching or drawing upward from the lower surface of the front end of the bottom plate 32, and the depth of the installation slot 44 can be made equal to the thickness of the fourth plate 50. In this way, when the fourth plate 50 is abutted and connected to the bottom plate 32 and received in the installation slot 44, the lower surface of the fourth plate 50 and the lower surface of the bottom plate 32 are coplanar, so that they can abut other planes, such as the upper surface of the lower plate 17 of the main frame piece 13, at the same time. In other embodiments, the thickness of the fourth plate 50 may also be less than the depth of the installation slot 44.

In one optional embodiment, a lower surface of the front end of each rail 34 is supported on an upper surface of the third plate 49, and a front end surface of each rail 34 abuts the first plate 47. Two cuts 52 opposite to the guide slots 39 of the two rails 34 respectively are defined on the first plate 47 at both sides of the first inserting port 28. In this manner, the height of the guide rail 34 can be adjusted by the height of the third plate 49. In the embodiment, the upper surface of the third plate 49 is higher than the upper surface of the bottom plate 32, and the front end of the guide rail 34 and the middle and rear ends connected to the horizontal flanging portion 36 are higher than the upper surface of the bottom plate 32, suspending the guide rail 34, so that the guide slot 39 of the guide rail 34 is located at the height of the OCP card 60.

As described above, the adapter device 12 in the embodiment of the disclosure can be detachably connected to the PCIe bracket 11. Specifically, referring to FIG. 1 and FIG. 2, the adapter device 12 is configured to be installed in the installation space 15, the chassis 24 is detachably connected to the main frame piece 13, the front-end bracket 25 is detachably connected to the front frame piece 14, and the first insertion port 28 and the second insertion port 22 are in communication, to allow the OCP card 60 to be inserted therefrom.

Alternatively, one end of the first plate 47 is vertically connected with the second bending plate portion 54, and the other end of the second bending plate portion 54 extends outward to form an inserting sheet 55. The inserting sheet 55 can be inserted laterally into the clamping notch 23 of the front frame piece 14, and the second bending plate portion 54 is abutting the first bending plate portion 21 and detachably connected to the first bending plate portion 21 through a fastener 56.

Meanwhile, in this embodiment, in the installation state, the bottom plate 32 of the chassis 24 is abutting the lower plate 17 of the main frame piece 13, and the connection between the lower plate 17 and the bottom plate 32 can be made by a screw 57.

In this way, when mounting the adapter device 12 on the PCIe bracket 11 is required, insert the adapter device 12 into the PCIe bracket 11 from the assembly and disassembly port 19, insert the inserting sheet 55 of the front-end bracket 25 into the clamping notch 23 of the front frame piece 14, make the first plate 47 of the front-end bracket 25 correspond to the first front plate 20 of the front frame 14, abut the second bending portion 54 of the front end support 25 against the first bending portion 21 of the front frame 14 and attach them by the fastener 56. The bottom plate 32 is set against the lower plate 17 and attached by the screw 57, this attaches the adapter device 12 and the PCIe bracket 11. In FIG. 1, the fastener 56 and the screw 57 are not yet attached.

When the adapter device 12 is attached to the PCIe bracket 11 to form the bracket assembly 10, the bracket assembly 10 can receive the OCP card 60. When the adapter device 12 is removed from the PCIe bracket 11, the original PCIe bracket 11 can receive the PCIe card.

Referring to FIG. 8, the embodiment of the present disclosure further provides a server 58, which has a plurality of card mounting positions 59. At least one of the card mounting positions 59 is provided with the bracket assembly 10 described above. The bracket assembly 10 allows the server 58 to easily change for adapting to either the PCIe card or the OCP card 60, which is conducive to the space configuration of the server 58.

The above embodiments are only used to illustrate the technical solution of the application rather than for limitation. Although the application is described in detail with reference to the above preferred embodiments, those skilled in the art should understand that any modification or equivalent replacement of the technical solution of the application should not deviate from the spirit and scope of the technical solution of the application.

What is claimed is:

1. An adapter device, comprising:
   a chassis;
   a front-end bracket connected to a front end of the chassis, wherein the front-end bracket defines a first inserting port which is sized to receive an open compute project (OCP) card;
   an adapter assembly comprising an OCP interface, an adapter circuit board, and a PCIe interface, wherein the adapter circuit board is connected to a rear end of the chassis, the OCP interface opposite to the first inserting port is connected to the adapter circuit board, the PCIe interface is connected to an end away from the first inserting port of the adapter circuit board, the adapter circuit board is electrically connected between the OCP interface and the PCIe interface to realize interface conversion; and a rail assembly opposite to the first inserting port positioned between the front-end bracket and the OCP interface.

2. The adapter device of claim 1, wherein the chassis comprises a bottom plate and two flanging portions connected to the bottom plate on each side;
wherein the bottom plate defines opposed upper and lower surfaces, and the two flanging portions are located on the upper surface of the bottom plate;
wherein the rail assembly comprises two rails opposite to each other, each rail is connected to one of the two flanging portions.

3. The adapter device of claim 2, wherein each of the two flanging portions includes a vertical flanging portion and a horizontal flanging portion connected to the vertical flanging portion, each of the two horizontal flanging portions is spaced from and opposite to the bottom plate, and a receiving space is defined between each of the two horizontal flanging portions and the bottom plate;
each of the two rails includes a rail portion and a connecting portion attached to or formed with the rail portion, wherein the connecting portions positioned between the vertical flanging portions and the bottom plate are connected to the vertical flanging portions, wherein each of the rail portions defines a guide slot, and the guide slots of the two rails are opposite laterally, the guide slots are configured to slidably receive both sides of the OCP card.

4. The adapter device of claim 3, wherein each connecting portion is attached to or formed with one of the rail portions on a side away from each rail slot, the connecting portions are generally elongated, and an upper surface of the connecting portions is lower than an upper surface of each rail portion;
each of the connecting portions comprises a positioning protrusion on an upper surface of the connecting portion, and each of the horizontal flanging portions comprises a positioning slot opened laterally and adapted to each positioning protrusion;
each of the horizontal flanging portions is provided with a connecting aperture, and each of the connecting portions is provided with a threaded aperture opposite to the connecting aperture to receive a connecting screw to attach each connecting portion to each horizontal flanging portion.

5. The adapter device of claim 2, wherein a lower surface of the front end of the bottom plate is concave upward to form an installation slot;
the front-end bracket includes a socket bracket and a connecting bracket, and the connecting bracket is connected between the socket bracket and the bottom plate;
the socket bracket includes a first plate, a second plate and a third plate, wherein the first inserting port is provided on the first plate, and the second plate and the third plate are respectively connected to opposed upper and lower sides of the first plate;
the connecting bracket includes a fourth plate and a fifth plate, wherein the fourth plate positioned in the installation slot is fixedly connected to the front end of the bottom plate, and the fifth plate is vertically connected between the fourth plate and the third plate.

6. The adapter device of claim 5, wherein a lower surface of a front end of each rail is supported on an upper surface of the third plate, and a front end surface of each rail abuts the first plate;
two cuts opposite to the guide slots of the two rails respectively are defined on the first plate at both sides of the first inserting port.

7. A bracket assembly compatible with an open compute project (OCP) card and peripheral component interconnect express (PCIe) card, comprising:
a PCIe bracket; and
the adapter device of claim 1;
wherein the adapter device is detachably connected to the PCIe bracket.

8. The bracket assembly of claim 7, wherein the chassis includes a bottom plate and two flanging portions connected to the bottom plate on each side;
wherein the bottom plate defines opposed upper and lower surfaces, and the two flanging portions are located on the upper surface of the bottom plate;
wherein the rail assembly includes two rails opposite to each other, each rail is connected to one of the two flanging portions.

9. The bracket assembly of claim 8, wherein each of the two flanging portions includes a vertical flanging portion and a horizontal flanging portion connected to the vertical flanging portion, each of the two horizontal flanging portions is spaced to and opposite to the bottom plate, and a receiving space is defined between each of the two horizontal flanging portions and the bottom plate;
each of the two rails includes a rail portion and a connecting portion attached to or formed with the rail portion, wherein the connecting portions positioned between the vertical flanging portions and the bottom plate are connected to the vertical flanging portions, wherein each of the rail portions defines a guide slot, and the guide slots of the two rails are opposite laterally, the guide slots are configured to slidably receive both sides of the OCP card.

10. The bracket assembly of claim 9, wherein each connecting portion is attached to or formed with one of the rail portions on a side away from each rail slot, the connecting portions are generally elongate, and an upper surface of the connecting portions is lower than an upper surface of each rail portion;
each of the connecting portions is provided with a positioning protrusion on its upper surface, and each of the horizontal flanging portions is provided with a positioning slot opened laterally and adapted to each positioning protrusion;
each of the horizontal flanging portions is provided with a connecting aperture, and each of the connecting portions is provided with a threaded aperture opposite to the connecting aperture to receive a connecting screw to attach each connecting portion to each horizontal flanging portion.

11. The bracket assembly of claim 8, wherein a lower surface of the front end of the bottom plate is concave upward to form an installation slot;
the front-end bracket includes a socket bracket and a connecting bracket, and the connecting bracket is connected between the socket bracket and the bottom plate;
the socket bracket includes a first plate, a second plate and a third plate, wherein the first inserting port is provided on the first plate, and the second plate and the third plate are respectively connected to opposed upper and lower sides of the first plate;

the connecting bracket includes a fourth plate and a fifth plate, wherein the fourth plate positioned in the installation slot is fixedly connected to the front end of the bottom plate, and the fifth plate is vertically connected between the fourth plate and the third plate.

12. The bracket assembly of claim 11, wherein a lower surface of a front end of each rail is supported on an upper surface of the third plate, and a front end surface of each rail abuts the first plate;

two cuts opposite to the guide slots of the two rails respectively are defined on the first plate at both sides of the first inserting port.

13. The bracket assembly of claim 7, wherein the PCIe bracket includes a main frame piece and a front frame piece, wherein the main frame piece defines an installation space configured to receive the PCIe card, the front frame piece connected to a front end of the main frame piece is provided with a second inserting port communicated to the installation space;

the adapter device is configured to receive in the installation space, wherein the chassis is detachably connected to the main frame piece, the front-end bracket is detachably connected to the front frame piece, and the first inserting port is opposite to and communicated to the second inserting port.

14. The bracket assembly of claim 13, wherein an assembly and disassembly port is provided on one side of the PCIe bracket, the assembly and disassembly port is communicated to the installation space and configured to allow the insertion of the adapter device;

a clamping notch is provided with the front frame piece at a side away from the assembly and disassembly port of the front frame piece, and a first bending plate portion is provided on the front frame piece at a side adjacent to the assembly and disassembly port of the front frame piece, the first bending plate portion is perpendicular to a plane defined by the second inserting port;

an inserting sheet is provided with the front-end bracket at a side away from the assembly and disassembly port of the front-end bracket, and a second bending plate portion perpendicular to the plane where the first inserting port is located is provided with the front-end bracket at a side near the assembly and disassembly port of the front-end bracket, wherein the inserting sheet is inserted laterally and matched in the clamping notch, and the second bending plate portion is superposed on and connected to the first bending plate portion through a fastener.

15. A server, comprising:

a plurality of card mounting positions, and at least one of the card mounting positions is set with the bracket assembly of claim 14.

* * * * *